(12) United States Patent
Kagohashi

(10) Patent No.: US 12,652,755 B2
(45) Date of Patent: Jun. 9, 2026

(54) PRINTED WIRING BOARD

(71) Applicant: IBIDEN CO., LTD., Ogaki (JP)

(72) Inventor: Susumu Kagohashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 231 days.

(21) Appl. No.: 18/191,033

(22) Filed: Mar. 28, 2023

(65) Prior Publication Data

US 2023/0328882 A1 Oct. 12, 2023

(30) Foreign Application Priority Data

Mar. 29, 2022 (JP) ................................. 2022-052977
Jan. 18, 2023 (JP) ................................. 2023-005842

(51) Int. Cl.
*H05K 1/02* (2006.01)
*H05K 1/11* (2006.01)
*H05K 3/42* (2006.01)

(52) U.S. Cl.
CPC ........... *H05K 1/0298* (2013.01); *H05K 1/115* (2013.01); *H05K 3/423* (2013.01); *H05K 2201/09845* (2013.01)

(58) Field of Classification Search
CPC ...... H05K 1/0298; H05K 1/115; H05K 3/423; H05K 2201/09845; H05K 3/4644; H05K 2201/0209; H05K 2201/0338
See application file for complete search history.

(56) References Cited

U.S. PATENT DOCUMENTS

| | | | | |
|---|---|---|---|---|
| 7,552,531 | B2 * | 6/2009 | Takada ................... | H05K 3/421 |
| | | | | 174/254 |
| 9,078,366 | B2 * | 7/2015 | Adachi ................... | H05K 1/036 |
| 2009/0053459 | A1 * | 2/2009 | Hirose ................... | H05K 1/112 |
| | | | | 428/76 |
| 2010/0038111 | A1 * | 2/2010 | Yabe ..................... | C23C 14/165 |
| | | | | 204/192.15 |
| 2019/0393156 | A1 * | 12/2019 | Zierath ................... | C22C 30/00 |
| 2022/0071016 | A1 * | 3/2022 | Hwang ................... | H05K 3/427 |

FOREIGN PATENT DOCUMENTS

JP 2015-126103 A 7/2015

\* cited by examiner

*Primary Examiner* — Timothy J Thompson
(74) *Attorney, Agent, or Firm* — Finnegan, Henderson, Farabow, Garrett & Dunner, LLP

(57) ABSTRACT

A printed wiring board includes a first conductor layer, a resin insulating layer formed on the first conductor layer, a second conductor layer formed on a surface of the resin insulating layer, and a via conductor formed in an opening formed in the resin insulating layer such that the via conductor is connecting the first conductor layer and the second conductor layer. The via conductor is formed such that the via conductor includes a seed layer covering an inner wall surface of the resin insulating layer inside of the opening and an electrolytic plating layer formed on the seed layer such that the seed layer has a plurality of columnar parts grown in columnar shapes.

20 Claims, 7 Drawing Sheets

PRINTED WIRING BOARD

CROSS-REFERENCE TO RELATED APPLICATIONS

The present application is based upon and claims the benefit of priority to Japanese Patent Application No. 2023-005842, filed Jan. 18, 2023, and Japanese Patent Application No. 2022-052977, filed Mar. 29, 2022. The entire contents of these applications are incorporated herein by reference.

BACKGROUND OF THE INVENTION

Field of the Invention

The present invention relates to a printed wiring board.

Description of Background Art

Japanese Patent Application Laid-Open Publication No. 2015-126103 describes a printed wiring board having a conductor layer, an insulating layer formed on the conductor layer, another conductor layer formed on the insulating layer, and a via conductor connecting the conductor layers. The entire contents of this publication are incorporated herein by reference.

SUMMARY OF THE INVENTION

According to one aspect of the present invention, a printed wiring board includes a first conductor layer, a resin insulating layer formed on the first conductor layer, a second conductor layer formed on a surface of the resin insulating layer, and a via conductor formed in an opening formed in the resin insulating layer such that the via conductor is connecting the first conductor layer and the second conductor layer. The via conductor is formed such that the via conductor includes a seed layer covering an inner wall surface of the resin insulating layer inside of the opening and an electrolytic plating layer formed on the seed layer such that the seed layer has a plurality of columnar parts grown in a columnar shapes.

According to another aspect of the present invention, a printed wiring board includes a first conductor layer, a resin insulating layer formed on the first conductor layer, a second conductor layer formed on a surface of the resin insulating layer, and a via conductor formed in an opening formed in the resin insulating layer such that the via conductor is connecting the first conductor layer and the second conductor layer. The second conductor layer and the via conductor includes a seed layer and an electrolytic plating layer formed on the seed layer such that the seed layer is covering an inner wall surface of the resin insulating layer in the opening and has a first smooth portion and a second smooth portion electrically connected to the first smooth portion and that a part of the first smooth portion is formed on the second smooth portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
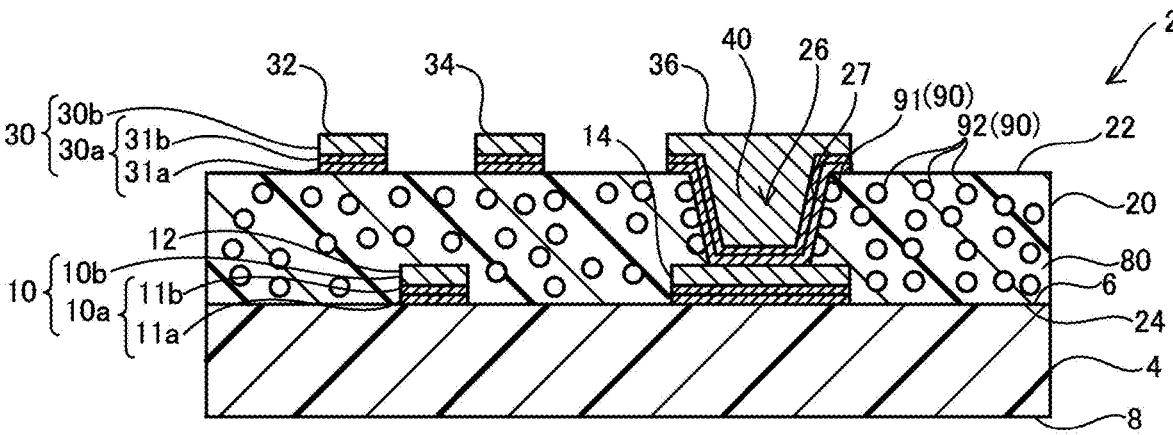
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2A:
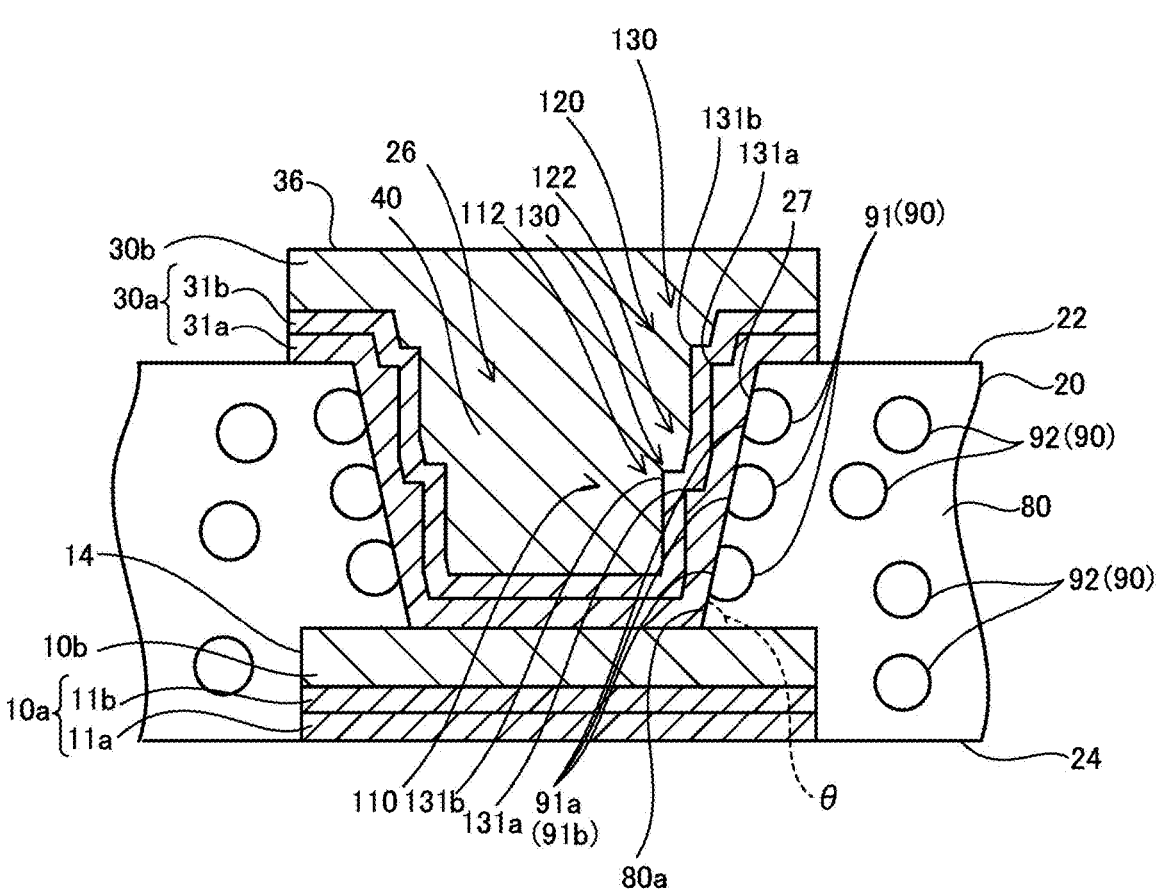
FIG. 2A is an enlarged cross-sectional view schematically illustrating a part of a printed wiring board according to an embodiment of the present invention.

FIG. 1 is a cross-sectional view illustrating a printed wiring board 2 according to an embodiment of the present invention. FIG. 2A is an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as silica particles. The insulating layer 4 may contain a reinforcing material such as a glass cloth. The insulating layer 4 has a third surface 6 (upper surface in the drawing) and a fourth surface 8 (lower surface in the drawing) on the opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) is formed by a first layer (11a) on the third surface 6 and a second layer (11b) on the first layer (11a). The first layer (11a) is formed of a copper alloy. The copper alloy has a copper content (wt %) of 90% or more. The second layer (11b) is formed of copper. The electrolytic plating layer (10b) is formed of copper. The first layer (11a) is in contact with the insulating layer 4.

The resin insulating layer 20 is formed on the third surface 6 of the insulating layer 4 and on the first conductor layer 10. The resin insulating layer 20 has a first surface 22 (upper surface in the drawing) and a second surface 24 (lower surface in the drawing) on the opposite side with respect to the first surface 22. The second surface 24 of the resin insulating layer 20 faces the first conductor layer 10. The resin insulating layer 20 has an opening 26 that expose the pad 14. The resin insulating layer 20 is formed of a resin 80 and a large number of inorganic particles 90 dispersed in the resin 80. The resin 80 is an epoxy resin. Examples of the resin include a thermosetting resin and a photocurable resin. Examples of the inorganic particles 90 include silica particles and alumina particles.

As illustrated in FIGS. 1 and 2A, the inorganic particles 90 include first inorganic particles 91 forming an inner wall surface 27 of the opening 26 and second inorganic particles 92 embedded in the resin 80. The second inorganic particles 92 each have a spherical shape. The first inorganic particles 91 each have a shape obtained by cutting a sphere along a flat surface. The first inorganic particles 91 each have a shape obtained by cutting a second inorganic particle 92 along a flat surface. The first inorganic particles 91 and the second inorganic particles 92 are different in shape.

As illustrated in FIG. 1, the first surface 22 of the resin insulating layer 20 is mostly formed of the resin 80. A small amount of the inorganic particles 90 (second inorganic particles 92) are exposed from the first surface 22. No unevenness is formed on the first surface 22 of the resin insulating layer 20. The first surface 22 is not roughened. The first surface 22 is formed smooth. The first surface 22 has an arithmetic mean roughness (Ra) of 0.02 μm or more and 0.06 μm or less.

In another example, the first surface 22 of the resin insulating layer 20 may be formed only of the resin 80. In this case, the inorganic particles 90 (second inorganic particles 92) are not exposed from the first surface 22. The first surface 22 does not include surfaces of the second inorganic particles 92. No unevenness is formed on the first surface 22 of the resin insulating layer 20. The first surface 22 is not roughened. The first surface 22 is formed smooth.

Figures 3, 4A:
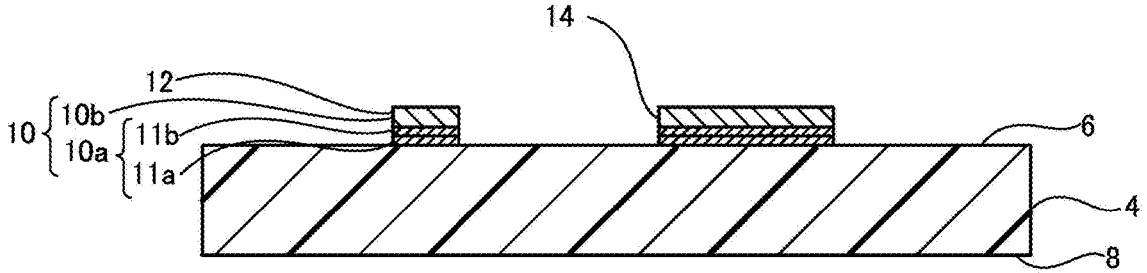
FIG. 3 is a cross-sectional photograph schematically showing a part of a printed wiring board according to an embodiment of the present invention.
FIG. 4A is a cross-sectional view schematically illustrating a method for manufacturing a printed wiring board according to an embodiment of the present invention.

FIG. 3 is a cross-sectional photograph showing an example of the inner wall surface 27 of the opening 26 and a seed layer (30a). As illustrated in FIGS. 2A and 3, the inner wall surface 27 of the opening 26 is formed of the resin 80 and the first inorganic particles 91. The first inorganic particles 91 each have a flat part (91a). The flat parts (91a) form the inner wall surface 27. The inner wall surface 27 is formed of the resin 80 and the flat parts (91a). The flat parts (91a) and the surface (80a) of the resin 80 that forms the inner wall surface 27 form a substantially common surface.

No unevenness is formed on the resin 80 that forms the inner wall surface 27. The surface (80a) of the resin 80 that forms the inner wall surface 27 is smooth. No unevenness is formed on exposed surfaces (91b) of the flat parts (91a) (surfaces that form the inner wall surface 27). The exposed surfaces (91b) of the flat parts (91a) are smooth. The inner wall surface 27 is formed smooth. As shown in FIG. 3, the inner wall surface 27 has a stepped part 28 near a boundary part between the surface (80a) of the resin 80 and the flat part (91a) of a first inorganic particle 91. The stepped part 28 has an amount of protrusion toward an opening direction, and the amount of protrusion is 0.5 μm or less.

As shown in FIG. 3, a step difference (28a) is formed at the boundary part between the surface (80a) of the resin 80 and the flat part (91a) of a first inorganic particle 91. An amount of the step difference (28a) is preferably 3.0 μm or less, more preferably 1.5 μm or less, and even more preferably 0.5 μm or less.

The flat parts (91a) of the first inorganic particles 91 substantially match a surface obtained by extending the surface (80a) of the resin 80 formed around the first inorganic particles 91 (a surface that forms the inner wall surface 27). The flat parts (91a) drawn with substantially straight lines in FIGS. 1 and 2A each mean a flat surface. In the cross sections illustrated in FIGS. 1 and 2A, the flat parts (91a) are each a flat surface. It is also possible that the flat parts (91a) are not each a perfect flat surface. The flat parts (91a) are each substantially a flat surface and are each substantially a smooth surface.

Figure 2B:
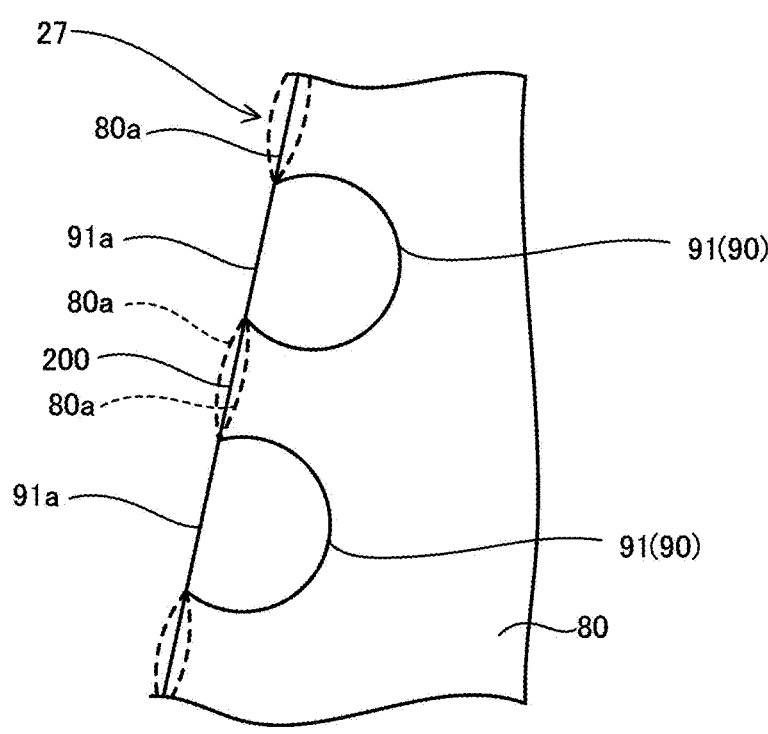
FIG. 2B is an enlarged cross-sectional view schematically illustrating a part of an inner wall surface.

FIG. 2B is an enlarged sectional view illustrating a part of the inner wall surface 27 in FIG. 2A. As illustrated in FIG. 2B, with respect to a reference surface 200 connecting the flat parts (91a) of two first inorganic particles 91 forming the inner wall surface 27, the surface (80a) of the resin 80 positioned between the two first inorganic particles 91 may be concave or convex (see broken lines).

As illustrated in FIG. 2A, the inner wall surface 27 of the opening 26 is inclined from the first surface 22 of the resin insulating layer 20 toward an upper surface of the pad 14. An angle (inclination angle) (θ) between the inner wall surface 27 and the upper surface of the pad 14 is 70 degrees or more and 90 degrees or less.

In the cross-sections illustrated in FIGS. 1 and 2A, the opening 26 is illustrated to have a substantially inverted trapezoidal shape. However, the opening 26 has actually a substantially inverted truncated cone shape. Therefore, the inner wall surface (side wall) 27 of the opening 26 is actually a substantially curved surface. That is, the common surface formed by the flat parts (91a) and the resin 80 includes the inner wall surface (side wall) 27 formed as a substantially curved surface.

As illustrated in FIG. 1, the second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30a) on the first surface 22 and an electrolytic plating layer (30b) on the seed layer (30a). The seed layer (30a) is formed by a first layer (31a) on the first surface 22 and a second layer (31b) on the first layer (31a). The first layer (31a) is formed of a copper alloy. The copper alloy has a copper content (wt %) of 90% or more. The electrolytic plating layer (30*b*) is formed of copper. The first layer (31*a*) is in contact with the first surface 22.

The via conductor 40 is formed in the opening 26. The via conductor 40 connects the first conductor layer 10 and the second conductor layer 30. In FIG. 1, the via conductor 40 connects the pad 14 and the land 36. The via conductor 40 is formed of a seed layer (30*a*) and an electrolytic plating layer (30*b*) on the seed layer (30*a*). The seed layer (30*a*) forming the via conductor 40 and the seed layer (30*a*) forming the second conductor layer 30 are the same. The seed layer (30*a*) forming the via conductor 40 is formed of a first layer (31*a*) covering inside (that is, the inner wall surface 27 of the opening 26 and the upper surface of the pad 14 exposed from the opening 26) of the opening 26 and a second layer (31*b*) on the first layer (31*a*). The first layer (31*a*) is in contact with the upper surface of the pad 14 and the inner wall surface 27.

As illustrated in FIGS. 2A and 3, the seed layer (30*a*) forming the via conductor 40 has multiple columnar parts 130 each formed by a conductor growing in a columnar shape. The columnar parts 130 each extend perpendicularly to the upper surface of pad 14 exposed from the opening 26. The seed layer (30*a*) is formed by the presence of the columnar parts 130 that are connected to the inner wall surface 27 of the opening 26. The seed layer (30*a*) is formed along a surface shape of the inner wall surface 27. The columnar parts 130 each include a columnar part (131*a*) of the first layer (31*a*) and a columnar part (131*b*) of the second layer (31*b*). The columnar part (131*a*) is formed by a conductor growing in a columnar shape during the formation of the first layer (31*a*). The columnar part (131*b*) is formed by a conductor that further grows in a columnar shape on the columnar part (131*a*) during the formation of the second layer (31*b*). The columnar part (131*a*) and the columnar part (131*b*) also extend perpendicularly to the upper surface of the pad 14. As illustrated in FIGS. 2A and 3, the seed layer (30*a*) covering the inner wall surface 27 has a stepped cross-sectional shape. The seed layer (30*a*) covering the first surface 22 of the resin insulating layer 20 and the upper surface of the pad 14 exposed from the opening 26 is formed in a surface shape.

Figure 2C:
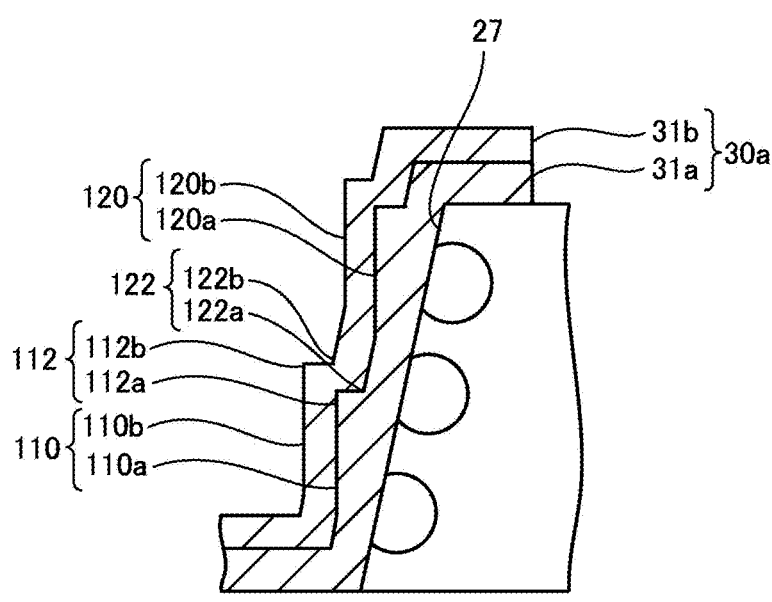
FIG. 2C is an enlarged cross-sectional view schematically illustrating a part of a seed layer.

FIG. 2C is an enlarged cross-sectional view schematically illustrating a part of the seed layer (30*a*) on the inner wall surface 27 of FIG. 2A. The seed layer (30*a*) on the inner wall surface 27 is in contact with the inner wall surface 27. As illustrated in FIGS. 2A, 2C and 3, the seed layer (30*a*) forming the via conductor 40 has a substantially smooth first portion 110 and a substantially smooth second portion 120. The first portion 110 and the second portion 120 are electrically connected. The first portion 110 and second portion 120 are continuous. As shown in FIG. 3, a part of the first portion 110 is formed on the second portion 120. A leading end 112 of the first portion 110 is formed on a trailing end 122 of the second portion 120. The first portion 110 and the second portion 120 are formed at the same time. The seed layer (30*a*) covering the inner wall surface 27 has a substantially step-shaped cross section.

As illustrated in FIG. 2C, the first layer (31*a*) of the seed layer (30*a*) has a first portion (110*a*) and a second portion (120*a*). The first portion (110*a*) and the second portion (120*a*) are electrically connected. The first portion (110*a*) and the second portion (120*a*) are continuous. A leading end (112*a*) of the first portion (110*a*) is formed on a trailing end (122*a*) of the second portion (120*a*). The first layer (31*a*) covering the inner wall surface 27 has a substantially step-shaped cross section. The first layer (31*a*) on the inner wall surface 27 is in contact with the inner wall surface 27.

The second layer (31*b*) of the seed layer (30*a*) has a first portion (110*b*) and a second portion (120*b*). The first portion (110*b*) and the second portion (120*b*) are electrically connected. The first portion (110*b*) and the second portion (120*b*) are continuous. A leading end (112*b*) of the first portion (110*b*) is formed on a trailing end (122*b*) of the second portion (120*b*). The second layer (31*b*) formed on the inner wall surface 27 has a substantially step-shaped cross section.

In the embodiment, a part of the first portion 110 is laminated on the second portion 120. A part of the first portion 110 overlaps the second portion 120. The leading end 112 of the first portion 110 is laminated on the trailing end 122 of the second portion 120. The leading end 112 of the first portion 110 overlaps the trailing end 122 of the second portion 120.

The inner wall surface 27 of the embodiment is formed as a substantially smooth surface. When the first layer (31*a*) follows the shape of the inner wall surface 27, the first layer (31*a*) on the inner wall surface 27 has a substantially smooth surface. The seed layer (30*a*) on the inner wall surface 27 has a substantially smooth surface. In this case, the electrolytic plating layer (30*b*) forming the via conductor 40 is formed on the smooth surface. For example, when the printed wiring board 2 is subjected to a large impact, peeling occurs between the first layer (31*a*) on the inner wall surface 27 and the second layer (31*b*) on the first layer (31*a*). Or, peeling occurs between the seed layer (30*a*) on the inner wall surface 27 and the electrolytic plating layer (30*b*) forming the via conductor 40.

Method for Manufacturing Printed Wiring Board

Figure 4B:
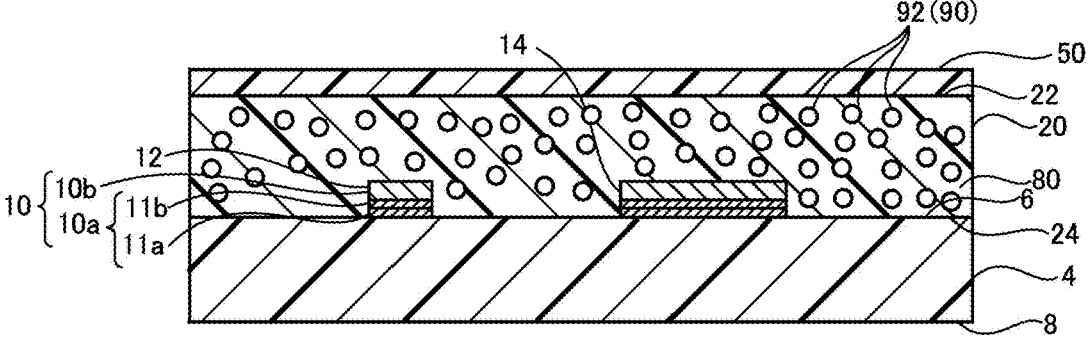
FIG. 4B is a cross-sectional view schematically illustrating a method for manufacturing a printed wiring board according to an embodiment of the present invention.
Figure 4C:
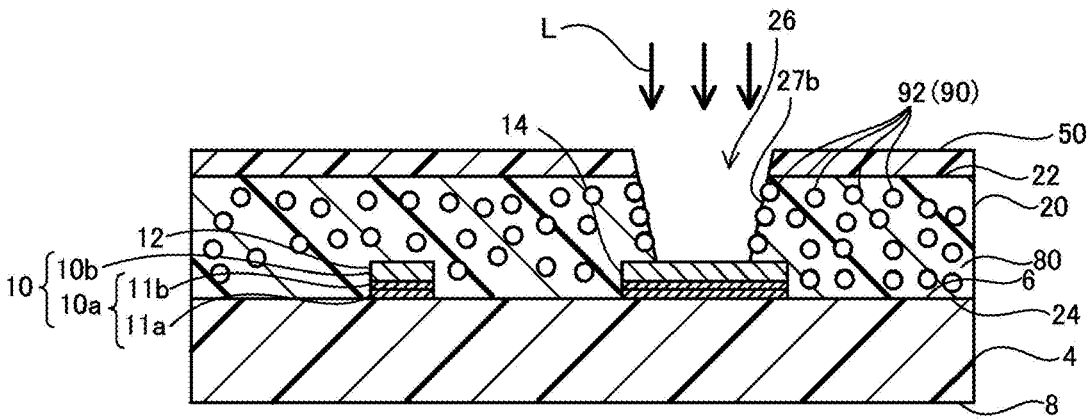
FIG. 4C is a cross-sectional view schematically illustrating a method for manufacturing a printed wiring board according to an embodiment of the present invention.
Figure 4D:
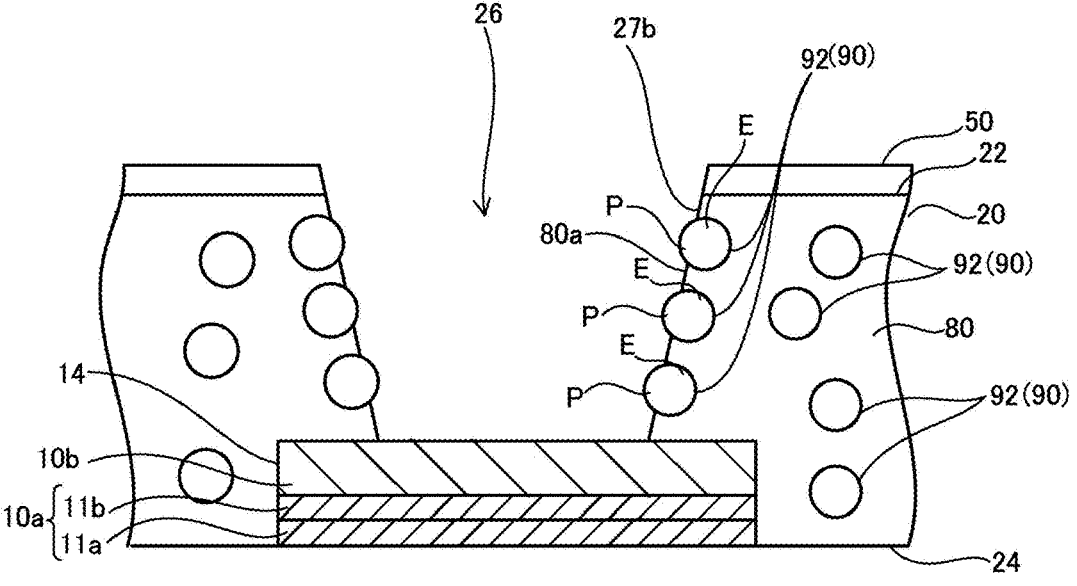
FIG. 4D is an enlarged cross-sectional view schematically illustrating a method for manufacturing a printed wiring board according to an embodiment of the present invention.
Figure 4E:
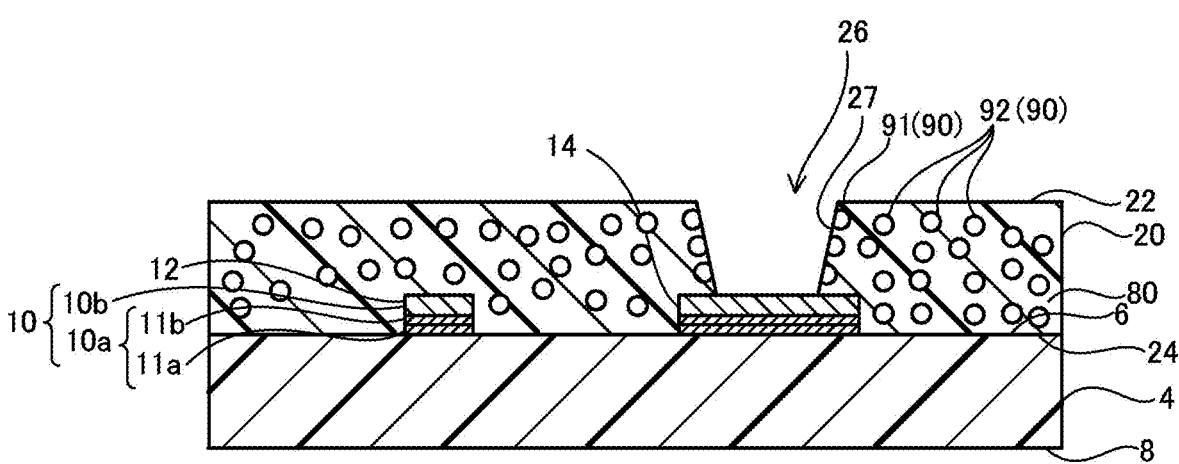
FIG. 4E is a cross-sectional view schematically illustrating a method for manufacturing a printed wiring board according to an embodiment of the present invention.
Figure 4F:
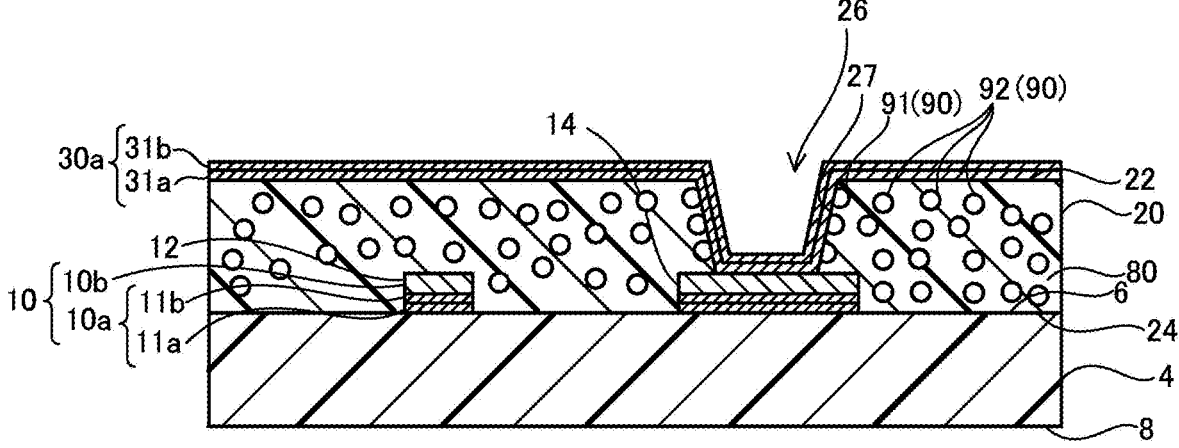
FIG. 4F is a cross-sectional view schematically illustrating a method for manufacturing a printed wiring board according to an embodiment of the present invention.
Figure 4G:
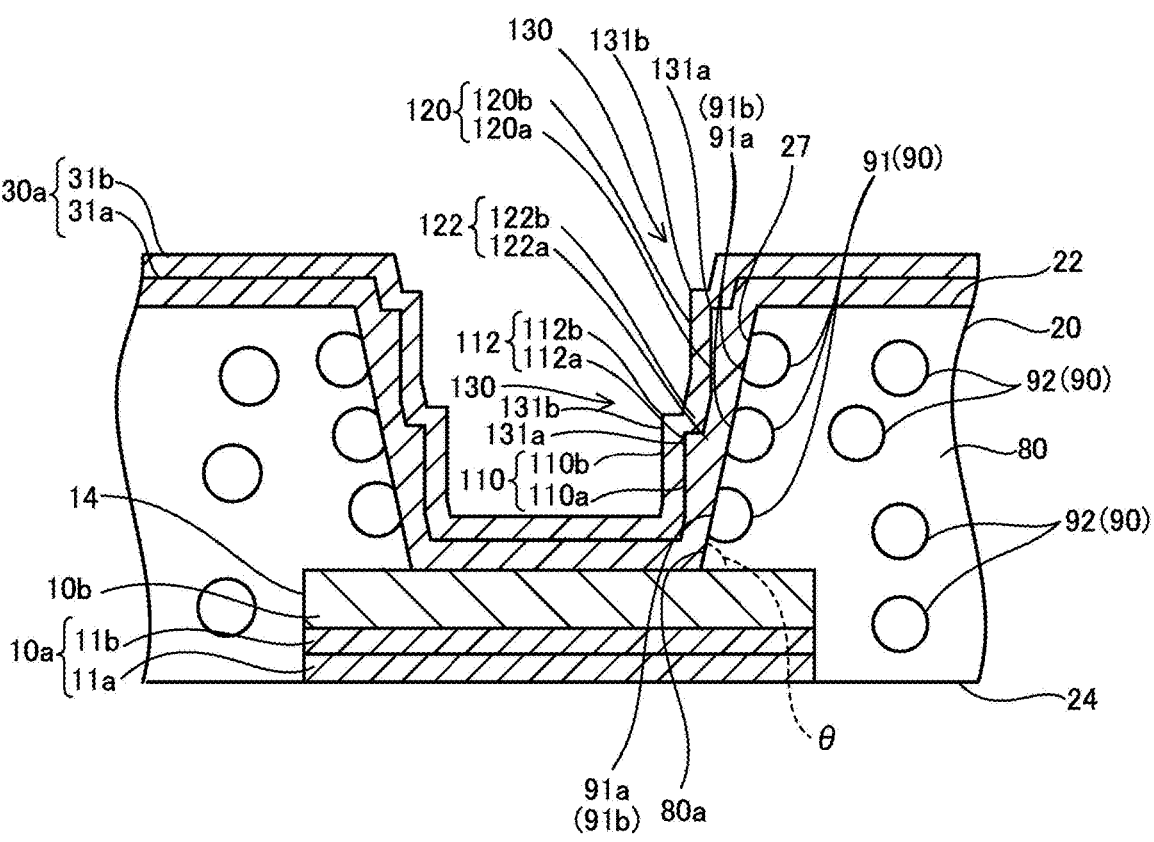
FIG. 4G is an enlarged cross-sectional view schematically illustrating a method for manufacturing a printed wiring board according to an embodiment of the present invention.

FIGS. 4A-4I illustrate a method for manufacturing the printed wiring board 2 of the embodiment. FIGS. 4A-4C, 4E, 4F, 4H, and 4I are cross-sectional views. FIGS. 4D and 4G are enlarged cross-sectional views. FIG. 4A illustrates the insulating layer 4 and the first conductor layer 10 formed on the third surface 6 of the insulating layer 4. The first conductor layer 10 is formed using a semi-additive method. The first layer (11*a*) and second layer (11*b*) are formed by sputtering. The electrolytic plating layer (10*b*) is formed by electrolytic plating.

As illustrated in FIG. 4B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20. The resin insulating layer 20 has the resin 80 and the inorganic particles 90 (the second inorganic particles 92). The inorganic particles 90 are mostly embedded in the resin 80.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

As illustrated in FIG. 4C, laser (L) is irradiated from above the protective film 50. The laser (L) penetrates the protective film 50 and the resin insulating layer 20 at the same time. The opening 26 for a via conductor reaching the pad 14 of the first conductor layer 10 is formed. The laser (L) is, for example, UV laser, or CO2 laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

FIG. 4D illustrates an inner wall surface (27b) of the opening 26 after the laser irradiation. The inner wall surface (27b) is formed of the resin 80 and the inorganic particles 90 protruding from the resin 80. In order to control the shape of the inner wall surface, the inner wall surface (27b) after the laser irradiation is treated. It is preferable to selectively remove the inorganic particles 90 protruding from the resin 80. As a result, the first inorganic particles 91 are formed from the inorganic particles 90. For example, the inorganic particles 90 protruding from the resin 80 are selectively removed by treating the inner wall surface (27b) after the laser irradiation with a chemical. Or, the inorganic particles 90 protruding from the resin 80 are selectively removed by treating the inner wall surface (27b) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (27b) after the laser irradiation, the first inorganic particles 91 having the flat parts (91a) (see FIG. 2A) are obtained. By controlling conditions for treating the inner wall surface (27b) after the laser irradiation, a shape of the inner wall surface (27b) can be controlled. Examples of the conditions are a temperature, a concentration, a time, a type of gas, and a pressure. The etching rate of the inorganic particles 90 and the etching rate of the resin are controlled.

By irradiating the resin insulating layer 20 with the laser (L), some of the second inorganic particles 92 embedded in the resin 80 form the inner wall surface (27b) after the laser irradiation. The second inorganic particles 92 forming the inner wall surface (27b) after the laser irradiation are each formed of a protruding portion (P) protruding from the resin 80 and a portion (E) embedded in the resin 80. The inner wall surface (27b) after the laser irradiation is treated. For example, the inner wall surface (27b) is treated with plasma of a gas containing tetrafluoromethane. The protruding portions (P) are selectively removed to form the inner wall surface 27 (FIGS. 1 and 2A) of the embodiment. The first inorganic particles 91 are formed from the second inorganic particles 92. By selectively removing the protruding portions (P), the first inorganic particles 91 having the flat parts (91a) are formed. The flat parts (91a) are flat surfaces. When the second inorganic particles 92 having spherical shapes are cut along a flat surface, the shapes of the first inorganic particles 91 are obtained. The inner wall surface 27 is formed of the flat parts (91a) and the surface (80a) of the resin 80, and exposed surfaces (91b) of the flat parts (91a) and the surface (80a) of the resin 80 are substantially positioned on the same flat surface. As shown in FIG. 3, the inner wall surface 27 has the stepped part 28 near a boundary part between the surface (80a) of the resin 80 and the flat part (91a) of a first inorganic particle 91. The stepped part 28 has an amount of protrusion toward an opening direction, and the amount of protrusion is 0.5 µm or less. For example, when the seed layer (30a) is formed on the inner wall surface (27b) by sputtering, the protruding portions (P) inhibit growth of a sputtering film. For example, a continuous seed layer (30a) is not formed on the inner wall surface (27b). Or, the seed layer (30a) is increased in thickness. A fine conductor circuit cannot be formed. In the embodiment, the projecting portions (P) are removed. The seed layer (30a) formed by sputtering can be reduced in thickness. Even when the seed layer (30a) formed by sputtering is thin, a continuous seed layer (30a) can be obtained.

Forming the opening 26 includes forming the inorganic particles 90 (the second inorganic particles 92) having the protruding portions (P). The protruding portions (P) protrude from the resin 80 forming the inner wall surface 27 of the opening 26. The first inorganic particles 91 are formed by removing the protruding portions (P) of the inorganic particles 90 (the second inorganic particles 92). The inner wall surface 27 of the opening 26 includes the exposed surfaces (91b) of the first inorganic particles 91. The exposed surfaces (91b) of the first inorganic particles 91 are formed by removing the protruding portions (P).

Obtaining the shapes of the first inorganic particles 91 by cutting the second inorganic particles 92 having spherical shapes along a flat surface includes removing the protruding portions (P) of the inorganic particles 90. The inner wall surface 27 of the opening 26 is actually a substantially curved surface. Since the flat parts (91a) are formed by removing the protruding portions (P), the exposed surfaces (91b) of the flat parts (91a) each include a curved surface. That is, forming a common surface with the flat parts (91a) and the resin 80 includes forming the inner wall surface 27 formed with a substantially curved surface.

No unevenness is formed on the inner wall surface 27. The inner wall surface 27 is formed smooth. As shown in FIG. 3, the step difference (28a) is formed at the boundary part between the surface (80a) of the resin 80 forming the inner wall surface 27 and the flat part (91a) of a first inorganic particle 91. An amount of the step difference (28a) is preferably 3.0 µm or less, more preferably 1.5 µm or less, and even more preferably 0.5 µm or less. By controlling the conditions for treating the inner wall surface (27b) after the laser irradiation, a size of unevenness or a size of the step difference is controlled.

The inside of the opening 26 is cleaned. By cleaning the inside of the opening 26, resin residues generated when the opening 26 is formed are removed. The cleaning of the inside of the opening 26 is performed using plasma. That is, the cleaning is performed in a dry process. The cleaning includes a desmear treatment. The first surface 22 of the resin insulating layer 20 is covered by the protective film 50, and thus, is not affected by the plasma. No unevenness is formed on the first surface 22 of the resin insulating layer 20. The first surface 22 is not roughened.

When treating the inner wall surface (27b) after the laser irradiation includes cleaning the inside of the opening 26, cleaning the inside of the opening 26 can be omitted.

As illustrated in FIG. 4E, after cleaning the inside of the opening 26, the protective film 50 is removed from the resin insulating layer 20. When treating the inner wall surface (27b) after the laser irradiation includes cleaning the inside of the opening 26, the protective film 50 is removed from the resin insulating layer 20 after treating the inner wall surface (27b) after the laser irradiation. When the inner wall surface (27b) after the laser irradiation is treated, the protective film 50 covers the first surface 22 of the resin insulating layer 20. After the protective film 50 is removed, the first surface 22 of the resin insulating layer 20 is not roughened.

As illustrated in FIG. 4F, the seed layer (30a) is formed on the first surface 22 of the resin insulating layer 20. The seed layer (30a) is formed by sputtering. The formation of the seed layer (30a) is performed in a dry process. The seed layer (30a) is also formed on the upper surface of the pad 14 exposed from the opening 26 and on the inner wall surface 27 of the opening 26. First, the first layer (31a) is formed on the first surface 22 by sputtering. At the same time, the first layer (31a) is formed on the inner wall surface 27 and the pad 14, which are exposed from the opening 26, by sputtering. As illustrated in FIG. 4G, the first layer (31*a*) formed on the inner wall surface 27 has the multiple columnar parts (131*a*) each formed by a conductor growing in a columnar shape. The columnar parts (131*a*) each extend perpendicularly to the upper surface of the pad 14. The first layer (31*a*) is formed by the presence of the columnar parts (131*a*) that are connected to the inner wall surface 27. As shown in FIG. 3, the inner wall surface 27 has the stepped part 28 near a boundary part between the surface (80*a*) of the resin 80 and the flat part (91*a*) of a first inorganic particle 91. The stepped part 28 has an amount of protrusion toward an opening direction, and the amount of protrusion is 0.5 μm or less. Metal particles forming the seed layer (30*a*) in this stepped part 28 are laminated in a direction perpendicular to the first surface 22. The multiple columnar parts (131*a*) are formed. Further, the columnar parts (131*b*) are laminated on surfaces and step surfaces of the columnar parts (131*a*). Examples of sputtering conditions are described below. A distance between a target and the first surface 22 of the resin insulating layer 20 is 50 mm or more and 250 mm or less. A voltage is 15 eV or more and 50 eV or less. A gas concentration is 0.1 Pa or more and 1.0 Pa or less.

The second layer (31*b*) formed on the first layer (31*a*) covering the inner wall surface 27 has the multiple columnar parts (131*b*) each formed by a conductor growing in a columnar shape. The columnar parts (131*b*) are formed by conductors that further grow on the columnar parts (131*a*). The columnar parts (131*b*) each extend perpendicularly to the upper surface of the pad 14. The second layer (31*b*) is formed by the presence of the columnar parts (131*b*) that are connected to the first layer (31*a*). The second layer (31*b*) is formed of copper. As described above, the seed layer (30*a*) is formed by forming the first layer (31*a*) and the second layer (31*b*). As illustrated in FIG. 4G, the seed layer (30*a*) is formed by the presence of the columnar parts 130 that are connected to the inner wall surface 27. Further, the seed layer (30*a*) covering the inner wall surface 27 has a stepped cross-sectional shape. A portion of the via conductor in contact with the inner wall surface of the opening has a small degree of roughness. Transmission loss is low when high frequency signals are transmitted.

As illustrated in FIG. 4G, the first layer (31*a*) formed on the inner wall surface 27 has the first portion (110*a*) and the second portion (120*a*). The first portion (110*a*) and the second portion (120*a*) are formed at the same time. The first portion (110*a*) and the second portion (120*a*) are electrically connected. The leading end (112*a*) of the first portion (110*a*) is formed on the trailing end (122*a*) of the second portion (120*a*). The first layer (31*a*) covering the inner wall surface 27 has a substantially step-shaped cross section. Examples of sputtering conditions are described below. A distance between a target and the first surface 22 of the resin insulating layer 20 is 50 mm or more and 250 mm or less. A voltage is 15 eV or more and 50 eV or less. A gas concentration is 0.1 Pa or more and 1.0 Pa or less.

The second layer (31*b*) formed on the first layer (31*a*) covering the inner wall surface 27 has the first portion (110*b*) and the second portion (120*b*). The first portion (110*b*) and the second portion (120*b*) are formed at the same time. The first portion (110*b*) and the second portion (120*b*) are electrically connected. The leading end (112*b*) of the first portion (110*b*) is formed on the trailing end (122*b*) of the second portion (120*b*). The second layer (31*b*) formed on the inner wall surface 27 has a substantially step-shaped cross section. Sputtering conditions are substantially the same as those described above. The inner wall surface 27 of the embodiment is formed of the surface (80*a*) of the resin 80 and the exposed surfaces (91*b*) of the first inorganic particles 91. These surfaces form a substantially common surface. The surface (80*a*) of the resin and the exposed surfaces (91*b*) are formed of different materials. And, the first layer (31*a*) is formed by sputtering. It is thought that the growth of the first layer (31*a*) formed on the surface (80*a*) of the resin 80 and the growth of the first layer (31*a*) formed on the exposed surfaces (91*b*) are different from each other. It is thought that the growth of the seed layer (30*a*) formed on the surface (80*a*) of the resin 80 and the growth of the seed layer (30*a*) formed on the exposed surfaces (91*b*) are different from each other. Therefore, in the embodiment, it is thought that the first portion 110 and the second portion 120 are formed. It is thought that the leading end (112*a*) of the first portion (110*a*) is formed on the trailing end (122*a*) of the second portion (120*a*). It is thought that the first layer (31*a*) has a substantially step-shaped cross section. It is thought that the second layer (31*b*) follows the first layer (31*a*). Therefore, it is thought that the second layer (31*b*) has the first portion (110*b*) and the second portion (120*b*). It is thought that the leading end (112*b*) of the first portion (110*b*) of the second layer (31*b*) is formed on the trailing end (122*b*) of the second portion (120*b*) of the second layer (31*b*). It is thought that the second layer (31*b*) has a substantially step-shaped cross section. Similarly, it is thought that the seed layer (30*a*) has the first portion 110 and the second portion 120. It is thought that the leading end 112 of the first portion 110 of the seed layer (30*a*) is formed on the trailing end 122 of the second portion 120 of the seed layer (30*a*). It is thought that the seed layer (30*a*) has a substantially step-shaped cross section.

The first layer (31*a*) on the inner wall surface 27 is formed on the substantially smooth inner wall surface 27. Therefore, in the embodiment, the first portion (110*a*) of the first layer (31*a*) and the second portion (120*a*) of the first layer (31*a*) can be formed to have substantially smooth surfaces. Similarly, the first portion (110*b*) of the second layer (31*b*) and the second portion (120*b*) of the second layer (31*b*) can be formed to have substantially smooth surfaces. The first portion 110 of the seed layer (30*a*) and the second portion 120 of the seed layer (30*a*) can be formed to have substantially smooth surfaces. When the surfaces are smooth, transmission loss can be reduced.

When the inner wall surface 27 has the step difference (28*a*) shown in FIG. 3, the first layer (31*a*) having the first portion (110*a*) and the second portion (120*a*) can be easily formed by sputtering. The seed layer (30*a*) having the first portion 110 and the second portion 120 can be easily formed. The leading end (112*a*) of the first portion (110*a*) can be formed on the trailing end (122*a*) of the second portion (120*a*). The leading end 112 of the first portion 110 can be formed on the trailing end 122 of the second portion 120. The first layer (31*a*) having a substantially stepped shape can be easily formed. The seed layer (30*a*) having a substantially stepped shape can be easily formed.

Figure 4H:
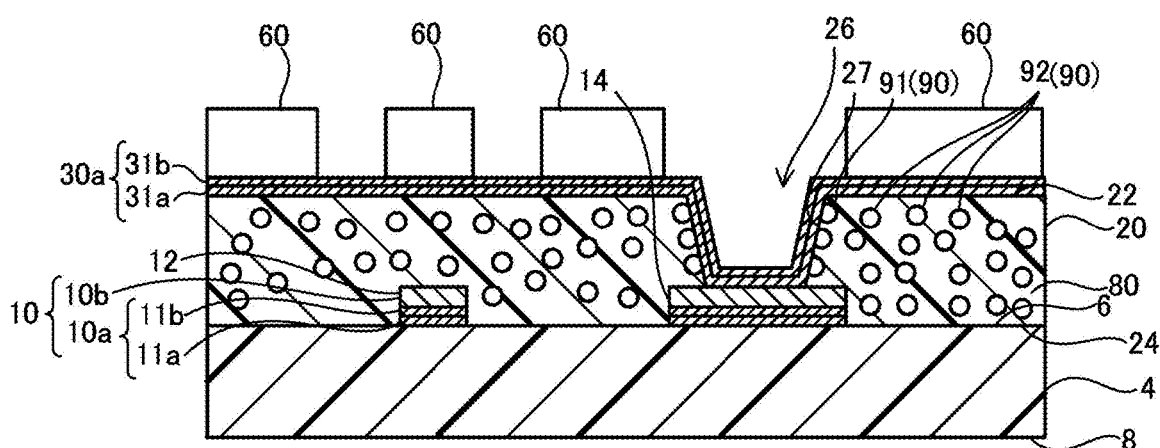
FIG. 4H is a cross-sectional view schematically illustrating a method for manufacturing a printed wiring board according to an embodiment of the present invention.

As illustrated in FIG. 4H, a plating resist 60 is formed on the seed layer (30*a*). The plating resist 60 has openings for forming the first signal wiring 32, the second signal wiring 34, and the land 36 (FIG. 1).

Figure 4I:
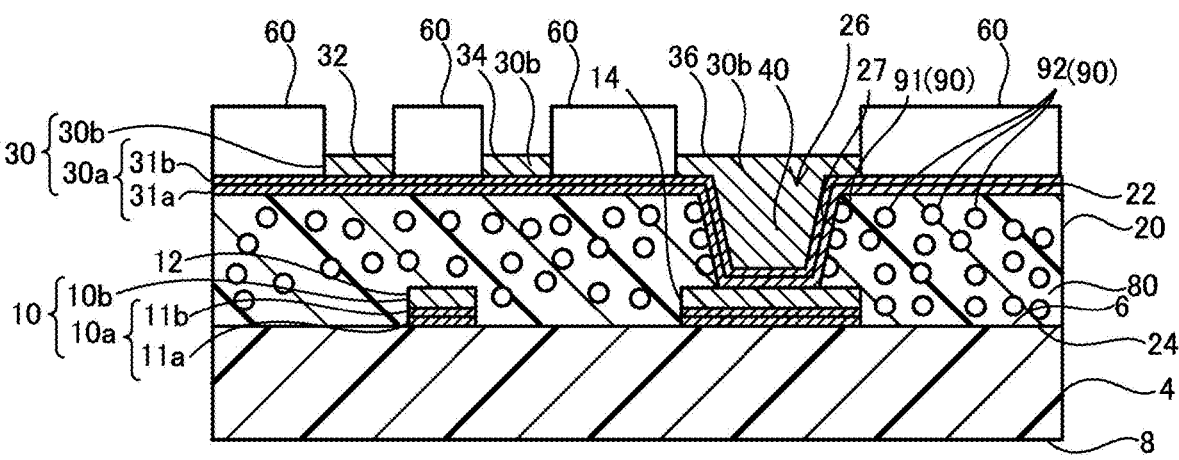
FIG. 4I is a cross-sectional view schematically illustrating a method for manufacturing a printed wiring board according to an embodiment of the present invention.

As illustrated in FIG. 4I, the electrolytic plating layer (30*b*) is formed on the seed layer (30*a*) exposed from the plating resist 60. The electrolytic plating layer (30*b*) is formed of copper. The electrolytic plating layer (30*b*) fills the opening 26. The first signal wiring 32, the second signal wiring 34, and the land 36 are formed by the seed layer (30*a*) and the electrolytic plating film (30*b*) on the first surface 22. The second conductor layer 30 is formed. The via conductor 40 is formed by the seed layer (30*a*) and the electrolytic plating film (30b) in the opening 26. The via conductor 40 connects the pad 14 and the land 36. The first signal wiring 32 and the second signal wiring 34 form a pair wiring.

After that, the plating resist 60 is removed. The seed layer (30a) exposed from the electrolytic plating layer (30b) is removed. The second conductor layer 30 and the via conductor 40 are formed at the same time. The printed wiring board 2 (FIG. 1) of the embodiment is obtained.

In the printed wiring board 2 of the embodiment (FIGS. 1 and 2A), the seed layer (30a) covering the inner wall surface 27 of the opening 26 has the columnar parts 130 each formed by a conductor growing in a columnar shape. The seed layer (30a) is smoothly formed on the inner wall surface 27 of the opening 26. Compared to the conventional structure in which the seed layer (30a) is filled in gaps of the inner wall surface 27 of the opening 26, a portion of the via conductor 40 in contact with the inner wall surface 27 of the opening 26 has a smaller degree of roughness. Transmission loss is low when high frequency signals are transmitted. A printed wiring board 2 with low transmission loss is provided. A high quality printed wiring board 2 is provided.

In the printed wiring board 2 of the embodiment (FIGS. 1-3), a part of the first portion 110 of the seed layer (30a) covering the inner wall surface 27 of the opening 26 is formed on the second portion 120. The first portion 110 and the second portion 120 partially overlap. Therefore, strength of the seed layer (30a) can be increased. The seed layer (30a) is unlikely to break. The seed layer (30a) is formed of the substantially smooth first portion 110 and the substantially smooth second portion 120. Therefore, transmission loss is low when high frequency signals are transmitted. A high quality printed wiring board 2 is provided.

In the printed wiring board 2 of the embodiment, the first surface 22 of the resin insulating layer 20 is mostly formed of the resin 80. A small amount of the inorganic particles 90 are exposed from the first surface 22. No unevenness is formed on the first surface 22. An increase in standard deviation of the relative permittivity in a portion near the first surface 22 of the resin insulating layer 20 is suppressed. The relative permittivity of the first surface 22 does not greatly vary depending on a location. Even when the first signal wiring 32 and the second signal wiring 34 are in contact with the first surface 22, a difference in propagation speed of an electric signal between the first signal wiring 32 and the second signal wiring 34 can be reduced. Therefore, in the printed wiring board of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of the logic IC can be suppressed. Even when a length of the first signal wiring 32 and a length of the second signal wiring 34 are 5 mm or more, a difference in propagation speed between the two can be reduced. Even when the length of the first signal wiring 32 and the length of the second signal wiring 34 are 10 mm or more and 20 mm or less, malfunction of the logic IC can be suppressed. A high quality printed wiring board 2 is provided. Although not illustrated in the drawings, each side of the printed wiring board 2 has a length of 50 mm or more. The length of each side is preferably 100 mm or more. The length of each side is 250 mm or less.

Other Examples

In another example of the embodiment, the first layer (11a) of the seed layer (10a) is formed of any one metal of aluminum, titanium, nickel, chromium, calcium, magnesium, iron, molybdenum, and silver.

In the present specification, the term "flat surface" is used with respect to the shape of the inner wall surface 27, the shapes of the flat parts (91a), and the shapes of the first inorganic particles 91. The meaning of the "flat surface" used with respect to these is illustrated in FIGS. 1 and 2A. That is, in FIGS. 1 and 2A, the inner wall surface 27 is drawn substantially straight. The shape of the inner wall surface 27 in FIGS. 1 and 2A is substantially a straight line. The term "flat surface" in the present specification includes a substantially straight line illustrated in a cross section. As illustrated in the cross sections of the first inorganic particles 91 in FIGS. 1 and 2A, in a cross section, cutting along a flat surface includes cutting along a straight line. The term "flat surface" in the present specification does not mean a perfect flat surface, but includes a substantial flat surface. A substantially flat surface may include small unevenness.

Japanese Patent Application Laid-Open Publication No. 2015-126103 describes a printed wiring board having a first conductor layer, an insulating layer formed on the first conductor layer, and a second conductor layer formed on the insulating layer. The insulating layer has a through hole for a via conductor exposing the first conductor layer. A via conductor connecting the first conductor layer and the second conductor layer is formed in the through hole. The via conductor is formed of an electroless plating layer and an electrolytic plating layer. The insulating layer contains a resin and inorganic particles.

As illustrated in FIG. 17 of Japanese Patent Application Laid-Open Publication No. 2015-126103, in Japanese Patent Application Laid-Open Publication No. 2015-126103, an intermediate layer is provided on a wall surface (inner peripheral surface) of the through hole. The intermediate layer has a complex uneven surface due to gaps formed between the inorganic particles. The inorganic particles contained in the intermediate layer are the same as the inorganic particles contained in the insulating layer. As illustrated in FIG. 22 of Japanese Patent Application Laid-Open Publication No. 2015-126103, in Japanese Patent Application Laid-Open Publication No. 2015-126103, an electroless plating film is formed in the through hole. The electroless plating film is formed along a shape of the unevenness formed in the intermediate layer. Or, the gaps formed in the intermediate layer are filled with the electroless plating film. However, it is thought that, in the technology of Japanese Patent Application Laid-Open Publication No. 2015-126103, a portion of the via conductor that is in contact with the inner wall surface of the through hole has a large degree of roughness. It is thought that transmission loss is large when high frequency signals are transmitted.

A printed wiring board according to one aspect of the present invention includes: a first conductor layer; a resin insulating layer that is formed on the first conductor layer, and has a via conductor opening exposing the first conductor layer, a first surface, and a second surface on the opposite side with respect to the first surface; a second conductor layer that is formed on the first surface of the resin insulating layer; and a via conductor that is formed in the opening and connects the first conductor layer and the second conductor layer. The via conductor is formed of a seed layer covering inside of the opening and an electrolytic plating layer on the seed layer. The seed layer has a columnar part formed by a conductor growing in a columnar shape.

A printed wiring board according to another aspect of the present invention includes: a first conductor layer; a resin insulating layer that is formed on the first conductor layer, and has a via conductor opening exposing the first conductor layer, a first surface, and a second surface on the opposite side with respect to the first surface; a second conductor layer that is formed on the first surface of the resin insulating layer; and a via conductor that is formed in the opening and connects the first conductor layer and the second conductor layer. The second conductor layer and the via conductor are formed of a seed layer and an electrolytic plating layer formed on the seed layer, the seed layer covering an inner wall surface of the opening has a substantially smooth first portion and a substantially smooth second portion, the first portion and the second portion are electrically connected, and a part of the first portion is formed on the second portion.

In a printed wiring board according to an embodiment of the present invention, the seed layer covering the inside of the opening has a columnar part formed by a conductor growing in a columnar shape. The seed layer is smoothly formed on the inner wall surface of the opening. Compared to the conventional structure in which the seed layer is filled in gaps of the inner wall surface of the opening, a portion of the via conductor in contact with the inner wall surface of the opening has a smaller degree of roughness. Transmission loss is low when high frequency signals are transmitted. A printed wiring board 2 with low transmission loss is provided.

In a printed wiring board according to an embodiment of the present invention, a part of the first portion of the seed layer covering the opening is formed on the second portion. The first portion and the second portion partially overlap. Therefore, strength of the seed layer is high. The seed layer is unlikely to break. The seed layer is formed of the substantially smooth first portion and the substantially smooth second portion. Therefore, transmission loss is low when high frequency signals are transmitted. A high quality printed wiring board is provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a first conductor layer;
a resin insulating layer formed on the first conductor layer;
a second conductor layer formed on a surface of the resin insulating layer; and
a via conductor formed in an opening formed in the resin insulating layer such that the via conductor is connecting the first conductor layer and the second conductor layer,
wherein the resin insulating layer has an inner wall surface in the opening such that the inner wall surface has a plurality of steps having a step difference in a range of 3.0 μm or less, the second conductor layer and the via conductor include a seed layer and an electrolytic plating layer formed on the seed layer such that the seed layer is covering the inner wall surface of the resin insulating layer in the opening and has a first smooth portion and a second smooth portion electrically connected to the first smooth portion and that a part of the first smooth portion is formed on the second smooth portion, and the seed layer of the via conductor is formed such that a leading end of the first smooth portion is formed on and overlapping a trailing end of the second smooth portion.

2. The printed wiring board according to claim 1, wherein the seed layer of the via conductor is formed such that the first smooth portion and the second smooth portion are formed in a same process.

3. The printed wiring board according to claim 1, wherein the seed layer of the via conductor is formed such that the seed layer has a step-shaped cross section formed on the inner wall surface of the resin insulating layer.

4. The printed wiring board according to claim 1, wherein the seed layer of the via conductor is formed such that the seed layer includes a first layer covering the inner wall surface of the resin insulating layer in the opening and a second layer formed on the first layer and that the first layer has the first smooth portion and the second smooth portion.

5. The printed wiring board according to claim 4, wherein the seed layer of the via conductor is formed such that the first layer has a step-shaped cross section.

6. The printed wiring board according to claim 1, wherein the resin insulating layer includes a resin material, first inorganic particles, and second inorganic particles such that each of the first inorganic particles has a flat part and that the inner wall surface of the resin insulating layer includes the flat part.

7. The printed wiring board according to claim 6, wherein the inner wall surface in the opening of the resin insulating layer is formed such that the rein material has concave or convex surfaces formed between the first inorganic particles, and the plurality of steps formed on the inner wall surface of the resin insulating layer includes a plurality of steps formed at a boundary portion between the concave or convex surfaces of the resin material and the flat part of one of the first inorganic particles on the inner wall surface.

8. The printed wiring board according to claim 6, wherein the resin insulating layer is formed such that the first inorganic particles are formed by removing protruding portions of inorganic particles protruding from the resin materiel in the opening.

9. The printed wiring board according to claim 6, wherein the resin insulating layer is formed such that the inner wall surface in the opening includes exposed surfaces of the first inorganic particles formed by removing protruding portions of the second inorganic particles.

10. The printed wiring board according to claim 1, wherein the plurality of steps formed on the inner wall surface of the resin insulating layer has a step difference of 1.5 μm or less.

11. The printed wiring board according to claim 6, wherein the plurality of steps formed on the inner wall surface of the resin insulating layer has a step difference of 1.5 μm or less.

12. The printed wiring board according to claim 1, wherein the plurality of steps formed on the inner wall surface of the resin insulating layer has a step difference of 0.5 μm or less.

13. The printed wiring board according to claim 1, wherein the seed layer of the second conductor layer and the via conductor includes a first layer and a second layer formed on the first layer.

14. The printed wiring board according to claim 13, wherein the seed layer of the second conductor layer and the via conductor includes the first layer comprising a copper alloy, and the second layer comprising copper.

15. The printed wiring board according to claim 14, wherein the seed layer of the second conductor layer and the via conductor includes the first layer comprising the copper alloy such that the copper alloy has a copper content of 90% or more.

16. The printed wiring board according to claim 10, wherein the seed layer of the second conductor layer and the via conductor is formed by sputtering.

17. The printed wiring board according to claim 10, wherein the seed layer of the second conductor layer and the via conductor includes a first layer and a second layer formed on the first layer.

18. The printed wiring board according to claim 17, wherein the seed layer of the second conductor layer and the via conductor includes the first layer comprising a copper alloy, and the second layer comprising copper.

19. The printed wiring board according to claim 18, wherein the seed layer of the second conductor layer and the via conductor includes the first layer comprising the copper alloy such that the copper alloy has a copper content of 90% or more.

20. The printed wiring board according to claim 17, wherein the seed layer of the second conductor layer and the via conductor is formed by sputtering.

\* \* \* \* \*